United States Patent

Gough

(10) Patent No.: US 6,722,971 B2
(45) Date of Patent: Apr. 20, 2004

(54) FAN CARRIER, COMPUTER SYSTEM AND METHOD OF INSTALLING AND REMOVING A FAN IN A COMPUTER SYSTEM

(75) Inventor: Gerald Ronald Gough, Houghton Regis (GB)

(73) Assignee: Sun Microsystems, Inc., Palo Alto, CA (US)

( * ) Notice: Subject to any disclaimer, the term of this patent is extended or adjusted under 35 U.S.C. 154(b) by 60 days.

(21) Appl. No.: 10/050,361

(22) Filed: Jan. 16, 2002

(65) Prior Publication Data

US 2002/0094772 A1 Jul. 18, 2002

(30) Foreign Application Priority Data

Jan. 17, 2001 (GB) .............................................. 0101214

(51) Int. Cl.$^7$ ................................................. H05K 7/20
(52) U.S. Cl. ........................................ 454/187; 361/695
(58) Field of Search ............................. 454/187; 361/695

(56) References Cited

U.S. PATENT DOCUMENTS

| | | | |
|---|---|---|---|
| 4,751,872 A | 6/1988 | Lawson, Jr. | |
| 5,822,186 A | 10/1998 | Bull et al. | ............ 361/695 |
| 5,877,938 A | 3/1999 | Hobbs et al. | |
| 6,031,719 A | 2/2000 | Schmitt et al. | |
| 6,040,981 A | 3/2000 | Schmitt et al. | |
| 6,061,237 A | 5/2000 | Sands et al. | |
| 6,115,237 A | 9/2000 | Zhorsky et al. | |
| 6,185,097 B1 | 2/2001 | Behl | |
| 6,213,819 B1 * | 4/2001 | Fan | ............ 439/894 |
| 6,215,659 B1 | 4/2001 | Chen | |
| 6,236,564 B1 * | 5/2001 | Fan | ............ 361/695 |
| 6,244,953 B1 * | 6/2001 | Dugan et al. | ............ 454/184 |
| 6,247,898 B1 | 6/2001 | Henderson et al. | |
| 6,252,770 B1 | 6/2001 | Yu et al. | |
| 6,285,547 B1 | 9/2001 | Vigeant et al. | |
| 6,322,042 B1 | 11/2001 | Nemec | |
| 6,330,156 B1 * | 12/2001 | Cresse | ............ 361/695 |
| 6,411,506 B1 | 6/2002 | Hipp et al. | |
| 6,549,406 B1 * | 4/2003 | Olesiewicz et al. | ............ 361/695 |
| 2002/0060900 A1 * | 5/2002 | Qiu | ............ 361/683 |
| 2002/0167797 A1 * | 11/2002 | Willers et al. | ............ 361/695 |
| 2002/0173265 A1 * | 11/2002 | Kipka et al. | ............ 454/184 |

OTHER PUBLICATIONS

UK Search Report Application No. GB 0101214.5, mailed May 24, 2002.
International Search Report Application No. PCT/GB02/00074, mailed Mar. 14, 2002.
"Pluggable Fan Assembly", IBM Corp., *IBM Technical Disclosure Bulletin*, vol. 32, No. 3A, Aug., 1989.
"Fan/Board Mounting Bracket", IBM Corp., *IBM Technical Disclosure Bulletin*, vol. 38, No. 06A, Jun. 1993.

* cited by examiner

Primary Examiner—Harold Joyce (57) ABSTRACT

A fan carrier defines one or more enclosures with each enclosure receiving a fan unit. A first wall of the carrier includes at least one air vent that can be covered by a fire mesh. A second wall is substantially perpendicular to the first wall. The first and second walls form two walls of an enclosure for a fan unit. The second wall extends outwardly from the enclosure to define ears with locating lugs for locating the fan unit in a housing of the computer system. A fan subassembly includes the fan carrier and at least one fan secured therein, whereby the fan assembly can be installed in the computer system much more easily that a fan without the carrier. The fan subassembly can be located adjacent a vented portion of a housing wall of the computer system in a gap in a flange of that housing wall. The ear of the fan carrier is configured to overly a portion of that flange adjacent the gap and with the lug being received in a hole in said portion of the flange. The fan subassembly can then be clamped in place by securing the cover to the housing, the cover clamping the ears over the flange with the lugs in the receiving holes in the flange. This arrangement allows for the fans to be mounted in the computer housing without any tools other than those that may be needed to secure the cover of the housing. This can greatly increase the speed of replacement of a faulty fan unit, as well as facilitating initial assembly of the computer system.

26 Claims, 8 Drawing Sheets

FAN CARRIER, COMPUTER SYSTEM AND METHOD OF INSTALLING AND REMOVING A FAN IN A COMPUTER SYSTEM

BACKGROUND OF THE INVENTION

This invention relates to fans for a computer system.

Most modern computer systems include fans that are used for cooling. Fans are particularly important in modern systems that employ processors operating at high clock speeds and/or compact computer housings.

Particularly as fans include moving components, they are vulnerable to failure in use. It is important, therefore, that fans can readily be replaced in the event of a failure. Typically, a faulty fan can be removed from a computer chassis by taking the cover off the computer system, disconnecting the electrical connections for the fan power supply and any sensors, releasing screws securing the fan in the computer chassis and lifting out the fan. A replacement fan can the be installed by the reverse series of operations, namely placing the fan in the appropriate location, fastening screws securing the fan in the computer chassis, making the electrical connections for the fan power supply and any sensors, and replacing the cover on the computer system. This process can be relatively time consuming, particularly if the screws securing the fan in place are not readily accessible. One would like to be able to minimise the downtime of the computer system when replacing a fan, particularly if the computer system concerned is a server providing services to clients.

The present invention seeks to address this by improving the ease of installation and/or removal of one or more fans in a computer system.

SUMMARY OF THE INVENTION

A first aspect of the invention provides a fan carrier for a computer system. The fan carrier defines an enclosure for receiving at least one fan unit. The fan carrier includes a first wall that includes at least one air vent and a second wall substantially perpendicular to the first wall. The first and second walls form two walls of the enclosure. Extensions from the second wall extend outwardly from the enclosure to define ears with locating lugs for locating the fan unit in a housing of the computer system.

An embodiment of the invention enables a fan subassembly that includes the fan carrier and at least one fan secured therein, whereby the fan assembly can be installed in the computer system much more easily that a fan without the carrier. The fan subassembly can be located adjacent a vented portion of a housing wall of the computer system in a gap in a flange of that housing wall. Each ear of the fan carrier is configured to overlie a portion of that flange adjacent the gap with the lug being received in a hole in said portion of the flange. The fan subassembly can then be clamped in place by securing the cover to the housing, the cover clamping the ears over the flange with the lugs in the receiving holes in the flange. This arrangement allows for the fans to be mounted in the computer housing without any tools other than those that may be needed to secure the cover of the housing. This can greatly increase the speed of replacement of a faulty fan unit, as well as facilitating initial assembly of the computer system.

The fan subassembly can be pre-assembled, with the fan or fans being secured in respective enclosures formed within the fan carrier using appropriate fastenings, for example screws that pass through holes in the first surface of the fan carrier.

A wire mesh can be provided to cover the aperture or apertures that form the vent in the first wall of the fan carrier. The wire mesh can prevent fire escaping from the housing in the event of a catastrophic failure of the computer system that causes a fire. The fire mesh can advantageously be secured in place between the first wall and a fan unit in the enclosure by the fasteners that secure the fan unit in the enclosure.

A third wall of the fan carrier substantially perpendicular to the first and second walls can further define the enclosure for a fan unit. Yet a further wall substantially parallel to the third wall which further wall extends away from the first wall by a distance greater than a depth of the enclosure, can be used to define a handle for manipulating the fan carrier.

A particular example of a fan carrier according to the invention defines first and second enclosures, each for receiving a respective fan unit. This fan carrier comprises third and fourth walls substantially perpendicular to the first and second walls and substantially parallel to each other, the third wall and fourth walls each form a wall of a respective fan enclosure. In this example, a further wall is provided that is substantially parallel to and is intermediate the third and fourth walls. This further wall separates the two enclosures and extends away from the first wall by a distance greater than a depth of each enclosure to define a handle for manipulating the fan carrier. This further wall can also serve to separate the airflow for the two fans in the adjacent enclosures.

The first wall of the fan carrier can be provided with a protrusion (e.g. a lip adjacent one edge thereof) to space the first wall from an abutting surface.

The fan carrier can be formed from sheet metal, for example from zinc plated mild steel. Electromagnetic interference (EMI) fingers can be secured to the second wall to reduce or prevent EMI from escaping from the computer housing.

Another aspect of the invention provides a fan subassembly comprising a fan carrier as described above in combination with at least one fan secured therein. Each fan unit can be provided with electrical connections for electrically connecting the fan units to the computer system.

A further aspect of the invention provides a computer system comprising a housing and a fan subassembly as described above. The fan subassembly can be located adjacent a vented portion of the housing wall of the computer system in a gap in a flange that extends along at least part of the housing wall. An ear of the fan carrier overlies a portion of the flange adjacent the gap and a lug on the ear is received in a hole in the flange. The cover, when in place on the computer housing, overlies the first wall of the fan carrier and the ears to secure the fan subassembly in place by bearing the ears down on the flange.

A method of installing a fan in a computer system includes providing a fan subassembly as described above. The fan subassembly is placed adjacent a vented portion of a wall of a housing of the computer system in a gap in a flange at an edge of the housing wall with ears of the fan carrier overlying a portion of the flange either side of the gap and with lug on the ears being received in respective holes in the flange. Electrical connections for the fan power supply and any sensors are made. Then the cover is placed on the computer system such that the cover overlies the first wall of the fan carrier and the ears to secure the fan subassembly in place by bearing the ears down on the flange.

A method of replacing a fan subassembly includes removing a cover of the computer system. Electrical connections for the fan power supply and any sensors are disconnected. Then the fan subassembly is lifted out and a replacement fan assembly is installed as described above.

It will be appreciated that the installation and replacement of the fan assembly can be achieved without the use of any tools other than any needed for removing and/or attaching the cover of the computer system.

Further aspects and advantages of the invention will become apparent from the following description of a preferred embodiment.

BRIEF DESCRIPTION OF THE DRAWINGS

Exemplary embodiments of the present invention will be described hereinafter, by way of example only, with reference to the accompanying drawings in which like reference signs relate to like elements and in which.

DESCRIPTION OF PARTICULAR EMBODIMENTS

Exemplary embodiments of the present invention are described in the following with reference to the accompanying drawings.

An exemplary embodiment of the present invention will now be described, by way of example only.

Figure 1:
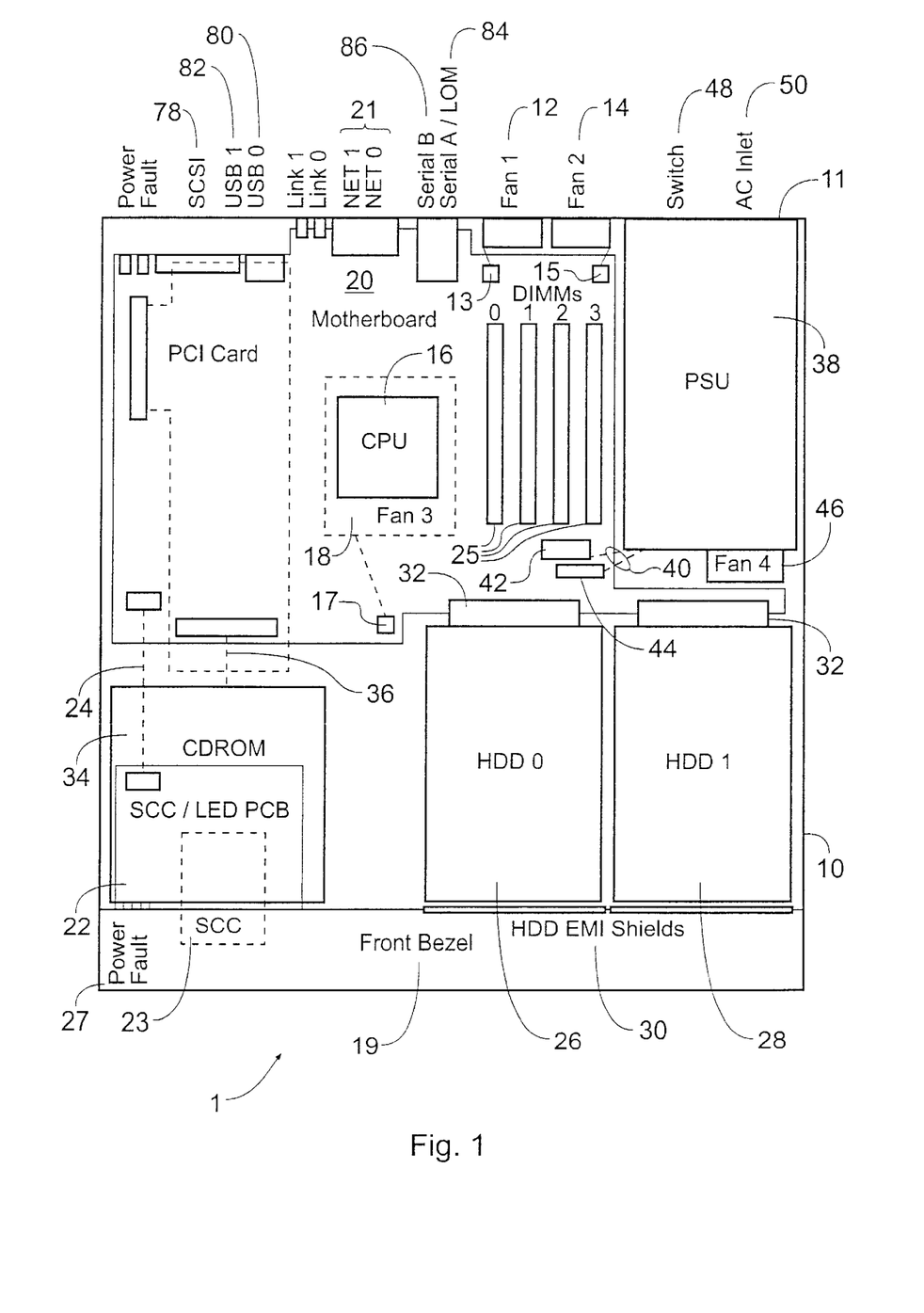
FIG. 1 is a physical plan view of a computer system that implements an embodiment of the invention.

FIG. 1 is a physical plan view of narrow form-factor computer system 1 designed for rack mounting. This computer system is compactly configured while offering high performance at reasonable cost.

The computer system 1 comprises a housing 10 with a front bezel 19 that is removable for front access to the disk drives and a System Configuration Card (SCC) 23 and reader 22. Rack mounting is supported for standard 19" racks via right-angled flanges (not shown). Slide-rail support is also provided.

The enclosure 10 is cooled, from front to rear, by two system fans 12, 14 mounted on a rear panel of the housing, with venting in the front and rear panels as required. The host processor (CPU) 16 also has its own dedicated local cooling comprising an impingement fan 18 that clips onto the CPU socket. These three fans plug directly into the motherboard 20 at 13, 15 and 17, respectively. The motherboard 20 is a PCB assembly, designed in a custom form-factor to fit the housing 10. The shape of the motherboard is chosen so as to minimise cabling within the housing. The motherboard 20 carries the majority of circuitry within the computer system 1.

All external interfaces are included directly on the rear edge of the motherboard, for access through the rear-panel 11 of the housing 10. The external interfaces comprise two network interfaces 21, two serial interfaces 84, 86 and a Small Computer System Interface (SCSI) interface 78. Indicators for Power, Fault and Network Link status are also positioned at the rear of the housing:

A system, or host, processor (CPU) 16 for the computer system 1 is mounted in a standard 370 pin zero insertion force (ZIF) socket on the motherboard 20. It has a passive heat sink. Dual in-line memory modules (DIMMs) are mounted in sockets 25 on the motherboard 20. A small printed circuit board (PCB) 22 is included at the front of the housing 10 to carry a System Configuration Card (SCC) 23 and LEDs 27 for Power and Fault status indication. A 10-way ribbon cable 24 connects this PCB to the motherboard 20. Two SCSI hard disk drives 26 and 28 are mountable in respective bays to the front of the motherboard 20. The drives are hot pluggable and are accessible by removal of the front bezel 19 and EMI shields 30. The two internal SCSI hard disk drives 26 and 28 plug directly into the motherboard via right-angled connectors 32 located on the front edge of the motherboard 20.

A slim (notebook-style) CDROM drive bay is provided, mounted laterally in front of the motherboard for a CDROM drive 34. Compact disks may be inserted and removed via an access slot (not shown) located on the lower left side of the front bezel 19. A connector at the rear of the CDROM bay connects the CDROM drive 34 via a ribbon cable 36 to the motherboard 20.

A Power Supply Unit (PSU) 38 is connected to the motherboard via a short harness 40 with two mating connectors 42 and 44 for power and services. The PSU 38 has its own cooling fan 46 and additionally houses the system power switch (48) and power input connector(s) 50.

Figure 2:
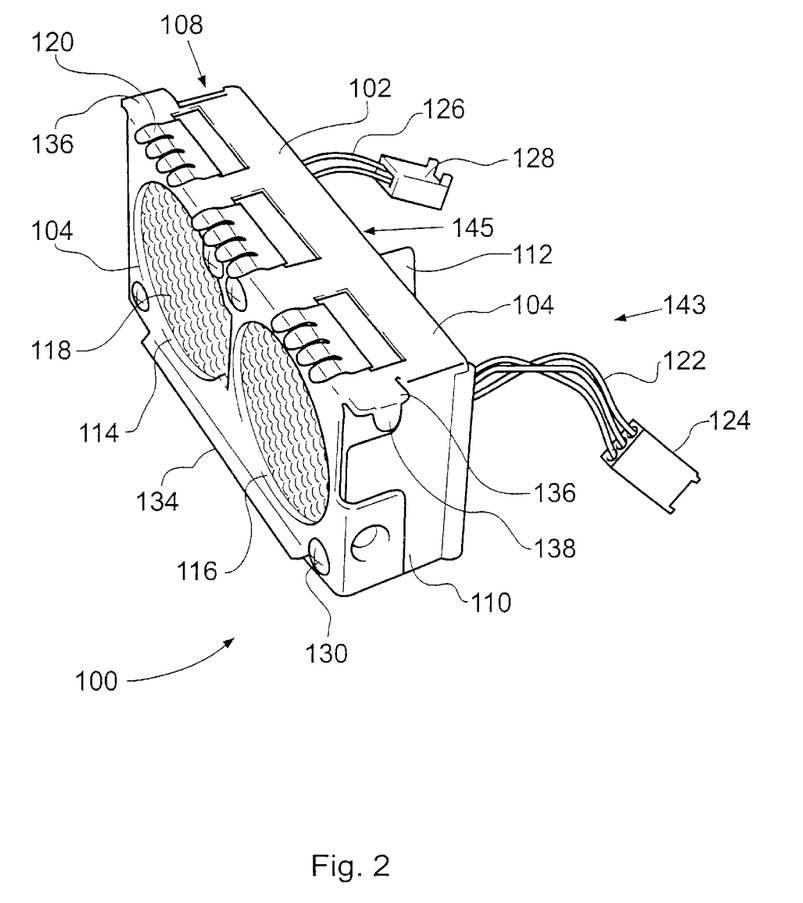
FIG. 2 is a first perspective view of an embodiment of a fan subassembly in accordance with an embodiment of the present invention.

FIG. 2 is a perspective view of a fan subassembly 100 according to an embodiment of the present invention. The fan subassembly includes a fan carrier 102 that has at least one fan secured therein. The present example of a fan carrier 102 is designed to provide two enclosures, each of which is designed to receive a single fan unit. As shown in FIG. 2, the fan carrier includes a first wall 104, a second wall 106 that is substantially perpendicular to the first wall 104, and third and fourth walls 108 and 110 that are each substantially perpendicular to the first and second walls 104 and 106, but are substantially parallel to each other. The walls 104, 106, 108 and 110 define a substantially box-shaped structure that is open on two sides (namely the back and the lower side as shown in FIG. 2). The walls 104, 106, 108 and 110 bound enclosures for receiving fan units. Also shown in FIG. 2 is a further wall 112 that extends substantially parallel to the walls 108 and 110 (that is substantially perpendicular to the walls 104 and 110 and intermediate those walls). The wall 112 extends rearwardly (as shown in FIG. 2) of the main box-like structure defined by the walls 104, 106, 108 and 110. This further wall 112 splits the base between the walls 108 and 110 into two, whereby the walls 104, 106, 108 and 112 define a first enclosure and the walls 104, 106, 110 and 112 define a second enclosure, each enclosure being configured to receive a separate fan unit. It will also be noted that the wall 112 extends beyond (rearwardly as shown in FIG. 2) the enclosures defined by the respective walls and serves to form a handle for manipulating the fan carrier 102 and the fan subassembly 100. Also, when the fans are operating, the further wall 112 serves to separate the airflow for the two fans. The walls of the fan carrier can be made of zinc-plated mild steel of 0.8 mm thickness.

FIG. 2 further illustrates that there are first and second apertures 114 and 116 in the first wall 104, these apertures forming respective vents for the fan units placed in the first and second enclosures. A woven wire mesh 118, that also acts as a fire screen, formed of fine wires or fire mesh, is located in the fan carrier 102 to cover the apertures 114 and 116. The wire mesh is secured in place by screws 130 that are used to secure the fan units within the fan carrier. The wire mesh is sandwiched between the first wall 104 and the fan units, when the latter are held in the fan carrier by the screws 130. By using a wire mesh, rather than merely perforating the first wall, good airflow (around the rounded wires of the mesh) can be achieved, while still providing gaps for the airflow that are small enough to prevent fire escaping. The wire mesh can also act as a finger guard.

FIG. 2 further illustrates the electrical wires 122/126 and electrical connectors 124/128 for the first and second fan units located in the fan subassembly 100. Electromagnetic interference (EMI) fingers 120 are provided along the edge of the second surface 104 for preventing leakage of electromagnetic radiation from the computer housing.

Figure 5:
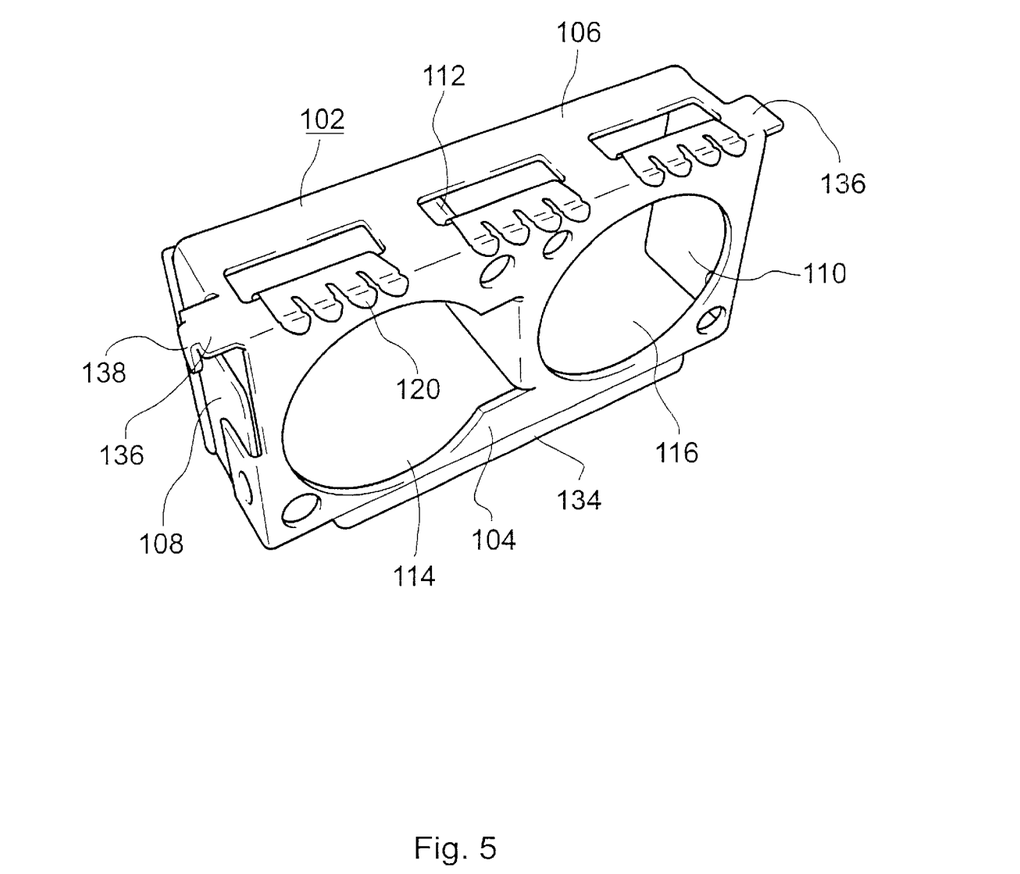
FIG. 5 is a perspective view of a fan carrier without the fans in place.

FIG. 2 also illustrates aspects of the fan carrier 102 that are used for mounting the fan subassembly 100 in the chassis of a computer system, as further illustrated in FIG. 5. In particular, ears 136 extend at either end of the second wall 106. These ears 136 are provided with downwardly depending lugs 138. As will be shown later with respect to FIG. 5, the ears are intended, in use, to overlie a flange of the computer system housing, with the lugs passing through holes in the flange. A protrusion in the form of a lip 134 is provided at the lower end of the first wall 104, the lip 134 serving, when the fan carrier is located in the computer system housing, to maintain the first wall 104 substantially parallel to a vented rear wall of the computer system housing.

Figure 3:
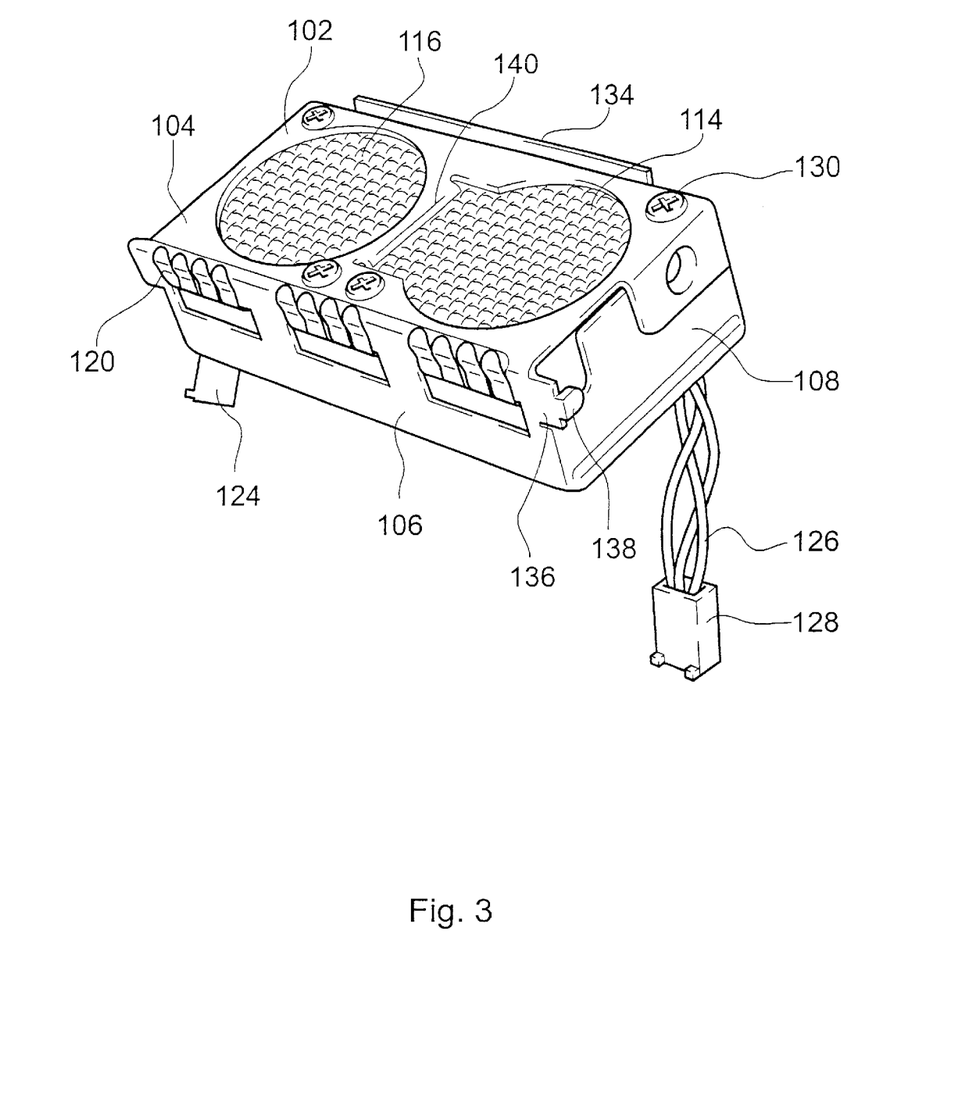
FIG. 3 is a perspective view, from a different angle, of the fan subassembly of FIG. 2.

FIG. 3 is a further perspective view, from a different angle of the fan carrier 102. The further perspective view shown in FIG. 3 more clearly illustrates the lip 134. It also illustrates how the further wall 112 is formed by folding back a tab at 140, the tab being formed by material from within a portion of the front wall that forms one of the apertures 114. It further illustrates the ears 136 with the lugs 138 from a different angle. The other reference signs used in FIG. 3 correspond to those used in FIG. 2. It will be appreciated that FIG. 3 provides a different perspective assisting in appreciation of the various aspects of the fan carrier 102.

Figure 4:
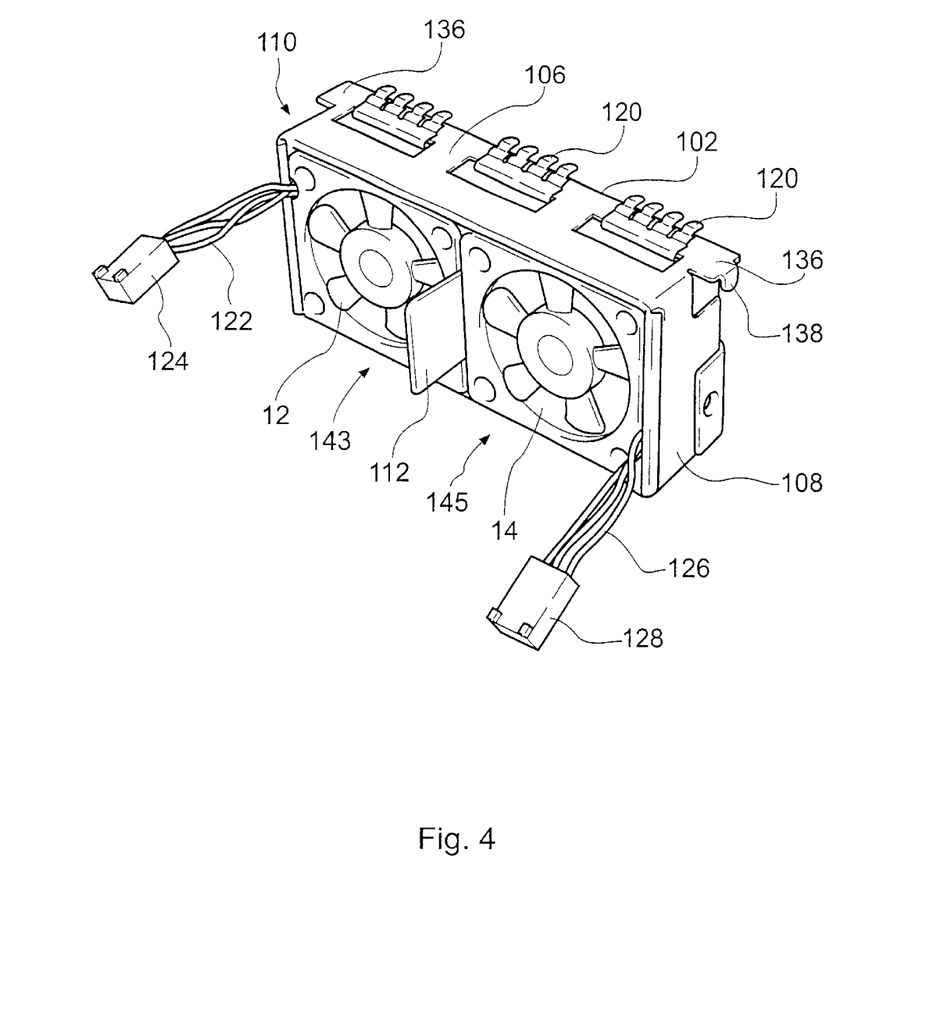
FIG. 4 is a yet a further perspective view from a further angle of the fan subassembly of FIG. 2.

FIG. 4 is a further perspective view of the fan carrier, shown from the rear of FIG. 2. This illustrates the first and second fan units 12 and 14 received within the enclosures 143 and 145 respectively. Enclosure 143 is defined by the walls 104, 106, 110 and 112. Enclosure 145 is defined by the walls 104, 106, 108 and 112. FIG. 4 clearly shows how the further wall 112 extends well beyond the fan units 12 and 14, and the enclosures 143 and 145 in which they are located, to define a handle for manipulating the fan carrier 102 and the subassembly formed by the combination of the fan carrier 102 and the fan units 12 and 14. Further reference signs indicated in FIG. 4 correspond to those used in FIGS. 2 and 3, whereby a comparison of the various features can be derived from these Figures.

Figure 6:
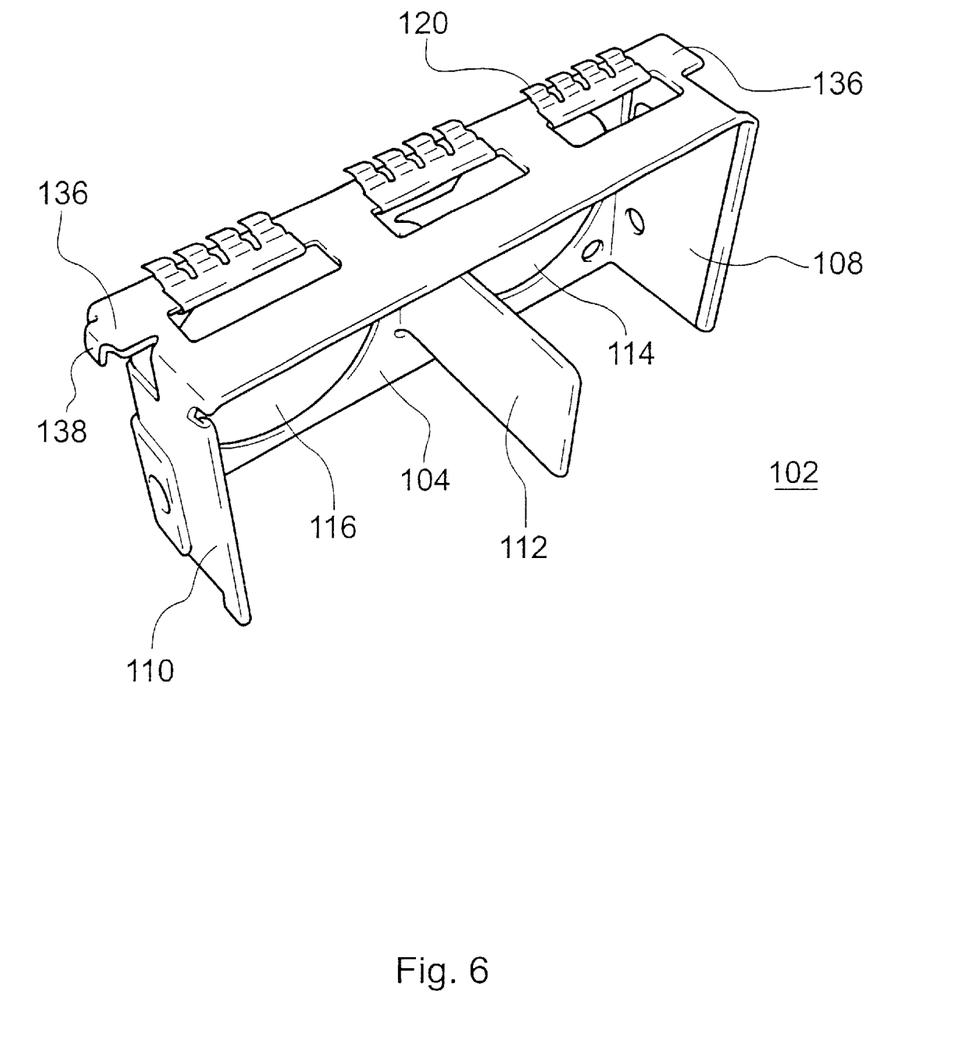
FIG. 6 is a further perspective view of the fan carrier of FIG. 5.

FIGS. 5 and 6 are perspective views from the front, and back, respectively of the fan carrier 102 without the wire mesh 118 and the fan units 12 and 14 in place. The same reference signs are used in these Figures as in the earlier Figures. The various features will not be described again in detail. However, it will be apparent to the skilled person from FIGS. 5 and 6 that the fan carrier 102 (without the EMI fingers 120) can be manufactured by folding a suitably shaped metal blank formed by stamping the shape of the blank from a sheet of appropriate metal (for example, as mentioned earlier, zinc-plated mild steel of 0.8 mm thickness).

Figure 7:
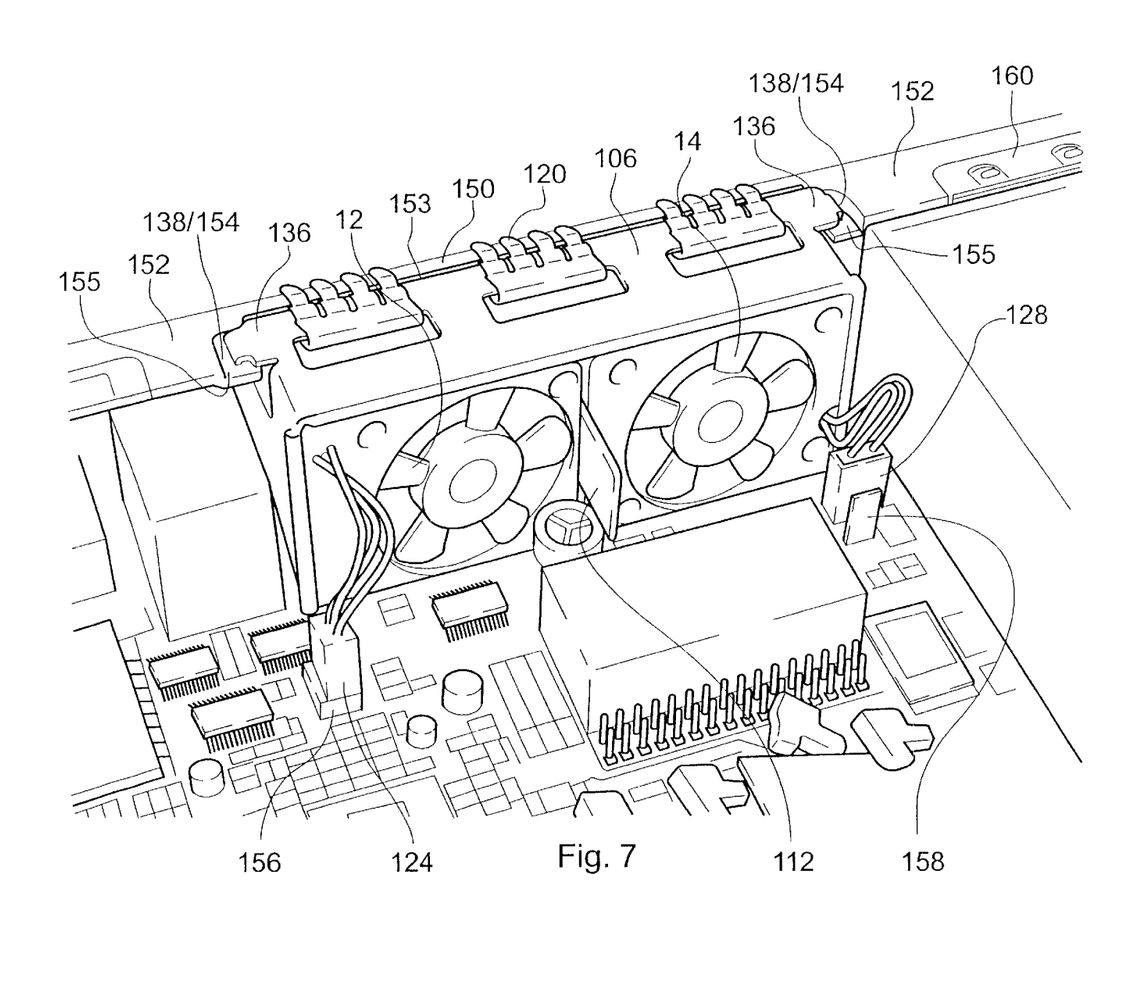
FIG. 7 is a perspective view showing the fan subassembly in situ in the computer system of FIG. 1.

FIG. 7 illustrates the fan subassembly including the fan carrier 102 and the fan units 12 and 14 located within the housing of the computer system of FIG. 1.

The fan subassembly 100 is mounted adjacent the rear panel or wall 150 of the computer system housing 10. The rear wall 150 of the computer system housing has apertures, for example in the form of a grid or grille (not shown) for venting air from the fans 12 and 14 to the rear of the computer system housing.

A flange 152 extends along the top of the rear wall 150. The flange 152 is cut away to form an opening 153 at the position where the fan subassembly is to be mounted. Either side of the opening 153 is a respective depressed portion 155 with a hole 154. When the fan carrier is mounted in the computer system housing, the ears 136 overlie the depressed portions 155 with the lugs 138 passing through the holes 154 thereby locating the fan carrier in position within the computer housing 10. When located in the computer housing, the lip 134 mentioned with regards to FIGS. 2 and 3 presses against the inside of the wall 150 to locate the fan carrier substantially vertically within the computer housing. The further wall 112 forming the handle is used to manipulate the fan carrier in and out of the computer system housing 10. It can be seen that the sprung EMI fingers 120 overlie the top edge of the wall 150 and cooperate with EMI strips 160 on the flange 152 to prevent EMI radiation from passing from the computer system housing when the cover of the housing is in place.

FIG. 7 illustrates how the connectors 124 and 128 are connected to releasable connectors 156 and 158, respectively, on the computer system motherboard 20. The cover 162 for the computer system housing is lowered onto the top of the housing in a first position, and is then slid towards the front of the housing and is secured using a screw with a knurled head. When the cover is applied, it bears down on the ears 136 and presses these against the depressed portions 155 of the flange 152, thereby securing the fan subassembly 100 including the fan carrier 102 and the fan units 12 and 14 within the computer system housing. Accordingly, it will be appreciated that the mounting and dismounting of the fan subassembly 100 can be achieved readily without the use of any tools apart from any tools needed to secure the cover on the housing. As indicated above, the cover could be secured with a screw with a knurled head, but could also be secured using a conventional cross head or other type of screw. The EMI fingers 120 are configured to be slightly springy, whereby the EMI fingers serve not only to contain EMI radiation, but also serve to absorb vibration and assist in the secure mounting of the fan carrier by being sandwiched between the cover and the fan carrier.

Figure 8:
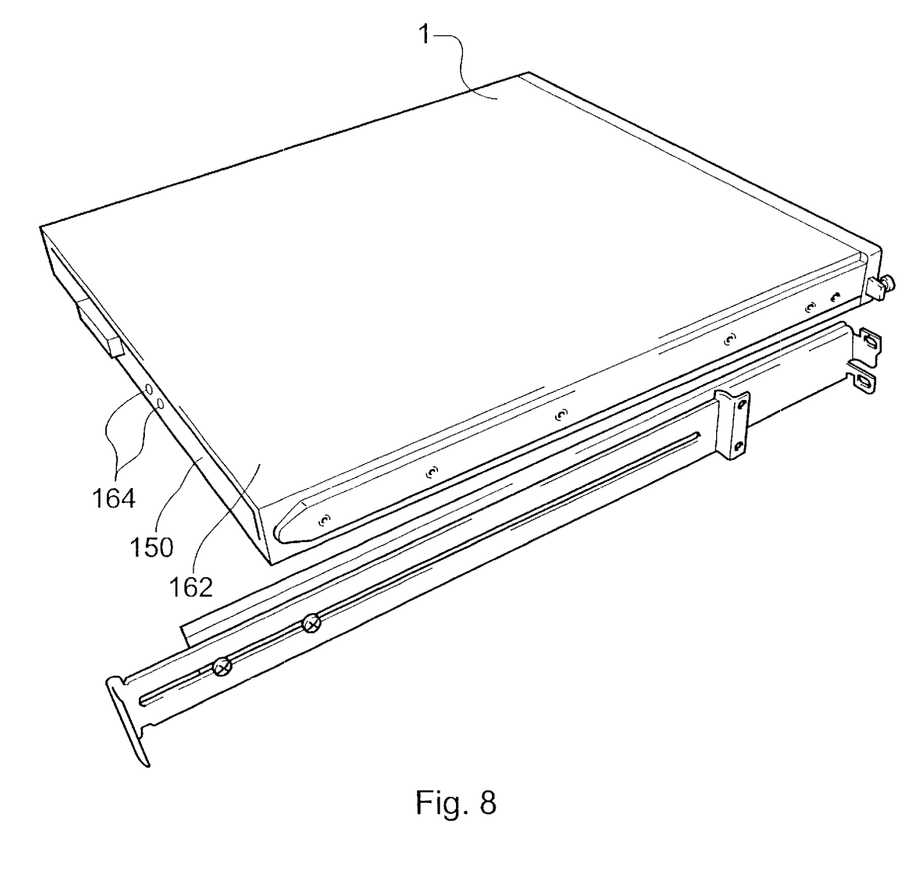
FIG. 8 is a perspective view of the computer system of FIG. 1.

FIG. 8 is a perspective view of the computer system 1 of FIG. 1 showing the vents 164 in the rear wall 150 of the computer system 1, and also showing the cover 164 of the computer system 1 in place.

Although a particular embodiment of the invention has been described, it will be appreciated that the invention is not limited thereto and that many modifications, including additions, deletions and substitutions may be made within the scope of the claimed invention.

For example, although the fan carrier is shown to contain two fans, in a given application, only one fan may be required. In this case a blanking plate could be secured instead of a fan unit in one of the enclosures defined by the fan carrier. Also, although the fan carrier of the preferred embodiment provides enclosures for two fans, it will be appreciated that in other embodiments other numbers of enclosures could be provided. In other words, other embodiments could be modified to provide one or more than two enclosures.

What is claimed is:

1. A fan carrier for a computer system, the fan carrier defining an enclosure for receiving at least one fan unit and including a first wall that includes at least one air vent and a second wall substantially perpendicular to the first wall that extends in a first direction along an edge of the first wall, the first and second walls forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating lugs for locating the fan carrier in a housing of the computer system.

2. The fan carrier of claim 1, wherein the first wall is configured to receive fasteners for fastening a fan unit within the fan carrier.

3. The fan carrier of claim 1, comprising a wire mesh covering the vent in the first wall.

4. The fan carrier of claim 1, comprising a third wall substantially perpendicular to the first and second walls, the third wall forming a wall of the enclosure.

5. The fan carrier of claim 4, further comprising a further wall substantially parallel to the third wall, the further wall extending away from the first wall by a distance greater than a depth of the enclosure, thereby to define a handle for manipulating the fan carrier.

6. The fan carrier of claim 1 for receiving at least two fan units, whereby the fan carrier defines first and second enclosures, each for receiving a respective fan unit.

7. The fan carrier of claim 6, comprising third and fourth walls substantially perpendicular to the first and second walls and substantially parallel to each other, the third wall and fourth walls each forming a wall of a respective fan enclosure.

8. The fan carrier of claim 7, further comprising a further wall substantially parallel to and intermediate the third and fourth walls, the further wall extending away from the first wall by a distance greater than a depth of each enclosure, thereby to define a handle for manipulating the fan carrier.

9. The fan carrier of claim 1, wherein the first wall is formed with a protrusion to space the first wall from an abutting surface.

10. The fan carrier of claim 1 formed from sheet metal.

11. The fan carrier of claim 10, wherein the sheet metal is zinc plated mild steel.

12. The fan carrier of claim 1 comprising electromagnetic interference fingers secured to the second wall.

13. A fan carrier for a computer system, the fan carrier defining an enclosure for receiving at least one fan unit and including a first wall that includes at least one air vent and a second wall substantially perpendicular to the first wall, the first and second walls forming two walls of the enclosure, extensions from the second wall extending outwardly from the enclosure to define ears with locating lugs for locating the fan carrier in a housing of the computer system, wherein the fan carrier further comprises a wire mesh covering the vent in the first wall and, wherein the wire mesh is secured in place between the first wall and a fan unit in the enclosure by fasteners that secure the fan unit in the enclosure.

14. A fan subassembly comprising a fan carrier with at least one fan secured therein, the fan carrier defining an enclosure for receiving at least one fan unit and including a first wall that includes at least one air vent and a second wall substantially perpendicular to the first wall that extends in a first direction along an edge of the first wall, the first and second walls forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating lugs for locating the fan carrier in a housing of the computer system.

15. The fan subassembly of claim 14, wherein the fan unit includes integral electrical connections for electrically connecting the fan units to the computer system.

16. The fan subassembly of claim 14, wherein the fan unit is secured in an enclosure defined by the fan carrier by means of screws.

17. The fan subassembly of claim 14, wherein the fan carrier defines two fan enclosures.

18. The fan subassembly of claim 17, comprising two fan units, each fan unit being secured in a respective enclosure.

19. A computer system comprising a housing and a fan subassembly, the fan subassembly comprising a fan carrier with at least one fan secured therein, the fan carrier defining an enclosure for receiving at least one fan unit and including a first wall that includes at least one air vent and a second wall substantially perpendicular to the first wall that extends in a direction alone an edge of the first wall, the first and second walls forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating lugs for locating the fan carrier in a housing of the computer system.

20. The computer system of claim 19, wherein the computer system housing includes a housing wall formed with a vented portion and a flange that extends along at least part of one edge of the housing wall, and a cover that abuts the flange.

21. The computer system of claim 20, wherein the fan subassembly is located adjacent to the vented portion of the housing wall in a gap in the flange with an ear of the fan carrier overlying a portion of the flange adjacent to the gap and the lug being received in a hole in said portion of the flange.

22. The computer system of claim 21, wherein the cover, when in place on the computer housing, overlies the first wall of the fan carrier and the ears to secure the fan subassembly in place by bearing the ears down on the flange.

23. A method of installing a fan in a computer system, which method comprises:

providing a fan subassembly, the fan subassembly comprising a fan carrier with at least one fan secured therein, the fan carrier defining an enclosure for receiving at least one fan unit and including a first wall that includes at least one air vent and a second wall substantially perpendicular to the first wall that extends in a first direction along an edge of the first wall, the first and second walls forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating lugs for locating the fan carrier in a housing of the computer system;

placing the fan subassembly adjacent a vented portion of a wall of a housing of the computer system in a gap in a flange at an edge of the housing wall, the ears of the fan carrier overlying a portion of the flange either side of the gap with each lug being received in a respective hole in the flange;

making the electrical connections for the fan power supply and any sensors; and placing the cover on the computer system such that the cover overlies the first wall of the fan carrier and the ears to secure the fan subassembly in place by bearing the ears down on the flange.

24. A method of replacing a fan subassembly in a computer system, the fan subassembly comprising a fan carrier with at least one fan secured therein, the fan carrier defining an enclosure for receiving at least one fan unit and including a first wall that includes at least one air vent and a second wall substantially perpendicular to the first wall that extends in a first direction along an edge of the first wall, the first and second walls forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating lugs for locating the fan carrier in a housing of the computer system, which method comprises:

removing a cover of the computer system, disconnecting the electrical connections for a fan power supply and any sensors, lifting out a fan subassembly; and installing a replacement fan assembly, wherein said installing comprises placing said replacement fan assembly adjacent a vented portion of a wall of a housing of the computer system in a gap in a flange at an edge of the housing wall, the ears of the fan carrier overlying a portion of the flange either side of the gap with each lug being received in a respective hole in the flange;

making the electrical connections for the fan power supply and any sensors; and placing the cover on the computer system such that the cover overlies the first wall of the fan carrier and the ears to secure said replacement fan assembly in place by bearing the ears down on the flange.

25. Fan carrier means for a computer system, the fan carrier functioning to provide an enclosure for receiving at least one fan unit and comprising a first wall that includes air venting means for at least one fan unit and a second wall substantially perpendicular to the first wall that extends in a first direction along an edge of the first wall, the first and second wall forming two walls of the enclosure, a first extension from the second wall extending in the first direction outwardly from the enclosure to define a first ear, a second extension from the second wall extending in a direction opposite to the first direction outwardly from the enclosure to define a second ear, the first and second ears having locating means for locating the fan carrier in a housing of the computer system.

26. A fan carrier for a computer system, the fan carrier defining an enclosure for receiving at least one fan unit and including a first wall that includes at least one air vent and a second wall substantially perpendicular to the first wall, the first and second walls forming two walls of the enclosure, extensions from the second wall extending outwardly from the enclosure to define ears with locating lugs for locating the fan carrier in a housing of the computer system, wherein the fan carrier further comprises a wire mesh covering the vent in the first wall, wherein the first wall is configured to receive fasteners for fastening a fan unit within the fan carrier wherein the wire mesh is secured in place between the first wall and a fan unit in the enclosure by fasteners that secure the fan unit in the enclosure.

* * * * *

UNITED STATES PATENT AND TRADEMARK OFFICE
CERTIFICATE OF CORRECTION

PATENT NO. : 6,722,971 B2
DATED : April 20, 2004
INVENTOR(S) : Gough

It is certified that error appears in the above-identified patent and that said Letters Patent is hereby corrected as shown below:

Column 8,
Line 31, please replace "alone" with -- along --.

Signed and Sealed this

Seventh Day of September, 2004

JON W. DUDAS
*Director of the United States Patent and Trademark Office*